US010849219B2

(12) United States Patent
Sikina et al.

(10) Patent No.: US 10,849,219 B2
(45) Date of Patent: Nov. 24, 2020

(54) SNAP-RF INTERCONNECTIONS

(71) Applicant: RAYTHEON COMPANY, Waltham, MA (US)

(72) Inventors: Thomas V. Sikina, Acton, MA (US); James E. Benedict, Lowell, MA (US); John P. Haven, Lowell, MA (US); Andrew R. Southworth, Lowell, MA (US); Semira M. Azadzoi, Tewksbury, MA (US)

(73) Assignee: RAYTHEON COMPANY, Waltham, MA (US)

( * ) Notice: Subject to any disclaimer, the term of this patent is extended or adjusted under 35 U.S.C. 154(b) by 9 days.

(21) Appl. No.: 16/287,240

(22) Filed: Feb. 27, 2019

(65) Prior Publication Data

US 2019/0269007 A1 Aug. 29, 2019

Related U.S. Application Data

(60) Provisional application No. 62/636,364, filed on Feb. 28, 2018.

(51) Int. Cl.
*H05K 1/11* (2006.01)
*H05K 1/14* (2006.01)
(Continued)

(52) U.S. Cl.
CPC .......... *H05K 1/0242* (2013.01); *H01P 3/081* (2013.01); *H01P 3/085* (2013.01); *H05K 1/0221* (2013.01);
(Continued)

(58) Field of Classification Search
CPC .. H05K 1/0242; H05K 1/0221; H05K 1/0224; H05K 3/462; H05K 1/144; H05K 3/04; H05K 3/368; H05K 3/4038; H05K 3/4007; H05K 3/0047; H05K 1/0253; H05K 1/0219; H05K 2201/09236;
(Continued)

(56) References Cited

U.S. PATENT DOCUMENTS

| 4,875,087 A | 10/1989 | Miyauchi et al. |
| 5,401,175 A | 3/1995 | Guimond et al. |

(Continued)

FOREIGN PATENT DOCUMENTS

| CN | 201845850 U | 5/2011 |
| CN | 106936521 A | 7/2017 |

(Continued)

OTHER PUBLICATIONS

International Search Report in application No. PCT/US2019/019851 dated May 29, 2019.
(Continued)

*Primary Examiner* — Yuriy Semenenko
(74) *Attorney, Agent, or Firm* — Lando & Anastasi, LLP (57) ABSTRACT

A radio frequency connector includes a substrate, a first ground plane disposed upon the substrate, a signal conductor having a first contact point, with the first contact point being configured to electrically mate with a second contact point, and a first ground boundary configured to electrically mate with a second ground boundary, with the first ground boundary being formed as an electrically continuous conductor within the substrate.

4 Claims, 7 Drawing Sheets

(51) Int. Cl.
| | |
|---|---|
| *H05K 1/02* | (2006.01) |
| *H05K 3/04* | (2006.01) |
| *H05K 3/36* | (2006.01) |
| *H05K 3/40* | (2006.01) |
| *H05K 3/00* | (2006.01) |
| *H01P 3/08* | (2006.01) |
| *H05K 3/46* | (2006.01) |

(52) U.S. Cl.
CPC ........... *H05K 1/0224* (2013.01); *H05K 1/144* (2013.01); *H05K 3/0047* (2013.01); *H05K 3/04* (2013.01); *H05K 3/368* (2013.01); *H05K 3/4007* (2013.01); *H05K 3/4038* (2013.01); *H05K 3/462* (2013.01); *H05K 1/0219* (2013.01); *H05K 1/0253* (2013.01); *H05K 2201/041* (2013.01); *H05K 2201/093* (2013.01); *H05K 2201/09236* (2013.01); *H05K 2203/0228* (2013.01)

(58) Field of Classification Search
CPC ..... H05K 2203/0228; H05K 2201/093; H05K 2201/041; H01P 3/085; H01P 3/081
See application file for complete search history.

(56) References Cited

U.S. PATENT DOCUMENTS

| | | | |
|---|---|---|---|
| 5,426,399 | A | 6/1995 | Matsubayashi et al. |
| 5,828,555 | A * | 10/1998 | Itoh ..................... H05K 1/0221 361/784 |
| 5,857,858 | A | 1/1999 | Gorowitz et al. |
| 6,000,120 | A | 12/1999 | Arledge et al. |
| 6,137,453 | A | 10/2000 | Wang et al. |
| 6,353,189 | B1 | 3/2002 | Shimada et al. |
| 6,400,234 | B1 | 6/2002 | Ohhashi et al. |
| 6,486,755 | B2 | 11/2002 | Aruga |
| 6,651,322 | B1 | 11/2003 | Currie |
| 6,674,347 | B1 * | 1/2004 | Maruhashi ............... H01P 3/003 333/161 |
| 6,747,217 | B1 | 6/2004 | Jochym et al. |
| 6,937,120 | B2 | 8/2005 | Fisher et al. |
| 7,038,622 | B2 | 5/2006 | Schmidt et al. |
| 7,405,477 | B1 | 7/2008 | Tao et al. |
| 7,443,279 | B2 | 10/2008 | Yagisawa et al. |
| 8,749,434 | B2 | 6/2014 | Han et al. |
| 2003/0067410 | A1 | 4/2003 | Puzella et al. |
| 2003/0188889 | A1 | 10/2003 | Straub et al. |
| 2003/0201851 | A1 | 10/2003 | Yoshida et al. |
| 2006/0044083 | A1 | 3/2006 | Kuzmenka |
| 2006/0214744 | A1 * | 9/2006 | Margomenos .......... H01P 1/047 333/33 |
| 2009/0000804 | A1 | 1/2009 | Kobayashi et al. |
| 2010/0182105 | A1 | 7/2010 | Hein et al. |
| 2010/0206617 | A1 | 8/2010 | Johnson et al. |
| 2010/0254094 | A1 * | 10/2010 | Ohhira .................... H01P 1/047 361/728 |
| 2013/0009729 | A1 * | 1/2013 | Kim ..................... H01P 11/003 333/238 |
| 2013/0154773 | A1 | 6/2013 | Siprak |
| 2015/0189754 | A1 | 7/2015 | Bohra et al. |
| 2015/0323576 | A1 | 11/2015 | Bulja et al. |
| 2016/0079646 | A1 | 3/2016 | Ichige |
| 2016/0172741 | A1 | 6/2016 | Panat et al. |
| 2017/0117620 | A1 | 4/2017 | Lapushin |
| 2018/0086628 | A1 * | 3/2018 | Vossough ............... G01P 15/093 |

FOREIGN PATENT DOCUMENTS

| | | |
|---|---|---|
| CN | 206742473 U | 12/2017 |
| EP | 1202377 A2 | 5/2002 |
| EP | 1473979 A1 | 11/2004 |
| GB | 2322237 A | 8/1998 |

OTHER PUBLICATIONS

Jung et al. "Inkjet-printed resistors with a wide resistance range for printed read-only memory applications", Organic Electronics (2013) vol. 14, pp. 699-702.
Kim et al. "Fabrication of Fully Inkjet-Printed Vias and SIW Structures on Thick Polymer Substrates", IEEE Transactions on Components, Packaging and Manufacturing Technology (2016) vol. 6, No. 3, pp. 486-496.
International Search Report and Written Opinion in application No. PCT/US2019/019847 dated May 29, 2019.
Kangasvieri et al. "An Ultra-Wideband BGA-Via Transition for High-Speed Digital and Millimeter-Wave Packaging Applications", IEEE (2007), pp. 1637-1640.
Bailey, M. "General Layout Guidelines for RF and Mixed-Signal PCBs", Maxim Integrated (2011), pp. 1-10. Retrieved from URL: <<https://pdfserv.maximintegrated.com/en/an/AN5100.pdf>>.
International Search Report and Written Opinion in application No. PCT/US2018/059636 dated Mar. 4, 2019.
Farhan Shafique et al. "Laser machining of microvias and trenches for substrate integrated waveguides in LTCC technology", Proceedings of the 39th European Microwave Conference (2009), pp. 272-275.
Deslandes et al. "Integrated Microstrip and Rectangular Waveguide in Planar Form", IEEE Microwave and Wireless Components Letters (2001) vol. 11, No. 2, pp. 68-70.
International Search Report and Written Opinion in application No. PCT/US2018/059625 dated Mar. 4, 2019.
Leib et al. "An ultra-wideband vertical transition from microstrip to stripline in PCB technology", Proceedings of 2010 IEEE International Conference on Ultra-Wideband (2010), p. 1-4.
International Search Report and Written Opinion in application No. PCT/US2018/059240 dated Mar. 4, 2019.
Mukherjee et al. "Broadband Substrate Integrated Waveguide Cavity-Backed Bow-Tie Slot Antenna", IEEE Antennas and Wireless Propagation Letters (2014) vol. 13, p. 1152-1155.
Liu et al. "Broadband Circularly Polarized Antenna With High Gain for Ku-band Applications", IEEE Conference Proceedings (2017), p. 1-2.
Kim et al. "Slot-Coupled Circularly Polarized Array Antenna With Substrate-Integrated Waveguide Cavity for Parallel-Plate-Mode Suppression", IEEE Transactions on Antennas and Propagation (2017) vol. 65, No. 8, p. 3999-4006.
Luo et al. "Antenna Array Elements for Ka-band Satellite Communication on the Move", Loughborough Antennas & Propagation Conference (2013), p. 135-139.
Beeresha et al. "Embedded Microstrip Line to Stripline Vertical Transition Using LTCC Technique", International Journal of Research in Engineering and Technology (2015) vol. 4, Issue 12, pp. 30-34.
Shan et al. "A Compact Broadband Stripline-fed Slot Antenna for Array Application", IEEE International Workshop on Antenna Technology (2005), pp. 555-558.
International Search Report and Written Opinion in application No. PCT/US2018/059602 dated Apr. 18, 2019.
Hong et al. "Grid Assembly-Free 60-GHz Antenna Module Embedded in FR-4 Transceiver Carrier Board", IEEE Transactions on Antennas and Propagation (2013) vol. 61, No. 4, pp. 1573-1580.
Invitation to Pay Additional Fees in application No. PCT/US2018/059410 dated Apr. 23, 2019.
International Search Report and Written Opinion in application No. PCT/US2018/059841 dated Mar. 4, 2019.
Sitaraman et al. "Modeling, Design and Demonstration of Integrated Electromagnetic Shielding for Miniaturized RF SOP Glass Packages", Electronic Components & Technology Conference (2015), p. 1956-1960.

* cited by examiner

SNAP-RF INTERCONNECTIONS

CROSS-REFERENCE TO RELATED APPLICATIONS

This application claims priority to U.S. Provisional Patent Application No. 62/636,364 filed Feb. 28, 2018, entitled SNAP-RF INTERCONNECTIONS, which is incorporated by reference herein in its entirety.

BACKGROUND

Radio frequency (RF) and electromagnetic circuits may be manufactured and disposed upon a printed circuit board (PCB) using conventional PCB manufacturing processes, and often require interconnection to various cables or other electromagnetic circuits, requiring bulky connectors that are lossy, fragile, and may have limited suitability for various frequency ranges. Conventional PCB manufacturing processes, such as lamination, electroplating, masking, etching, and other process steps may require multiple steps, expensive and/or hazardous materials, multiple iterations, extensive labor, etc., all leading to higher cost and slower turn-around time. Additionally, conventional PCB manufacturing processes have limited ability to allow for small feature sizes, such as signal trace dimensions, thereby limiting the range of highest frequency signals that may be supported by such devices.

SUMMARY

One aspect of the present disclosure is directed to a radio frequency connector comprising a substrate, a first ground plane disposed upon the substrate, a signal conductor having a first contact point, with the first contact point being configured to electrically mate with a second contact point, and a first ground boundary configured to electrically mate with a second ground boundary, with the first ground boundary being formed as an electrically continuous conductor within the substrate.

Embodiments of the radio frequency connector further may include an alignment element configured to align the first and second contact points. The radio frequency connector further may include a coupling element configured to secure mated contact between the first and second contact points. The coupling element may be a magnetic element.

Another aspect of the present disclosure is directed to a radio frequency interconnect structure comprising a first connector including a first substrate, a first ground plane disposed upon the first substrate, a first signal conductor having a first contact point, and a first ground boundary formed as an electrically continuous conductor within the first substrate. The radio frequency interconnect structure further comprises a second connector including a second substrate, a second ground plane disposed upon the second substrate, a second signal conductor having a second contact point configured to electrically mate with the first contact point of the first connector, and a second ground boundary formed as an electrically continuous conductor within the second substrate, with the second ground boundary being configured to electrically mate with the first ground boundary.

Embodiments of the radio frequency interconnect structure further may include an alignment element configured to align the first contact point of the first connector and the second contact point of the second connector. The radio frequency interconnect structure further may include a coupling element configured to secure mated contact between the first contact point of the first connector and the second contact point of the second connector. The coupling element may be a magnetic element.

Yet another aspect of the present disclosure is directed to a method of manufacturing a radio frequency connector. In one embodiment, the method comprises: milling a conductive material disposed upon a first substrate to form a signal trace, the signal trace including a terminal pad; bonding a second substrate to the first substrate to substantially encapsulate the trace and terminal pad between the first substrate and the second substrate; drilling through the second substrate to provide an access hole to the terminal pad; milling through the first and second substrate to form a trench, the trench positioned at least partially around the terminal pad; depositing a conductor into the access hole, the conductor making electrical connection to the terminal pad; and depositing a conductive ink into the trench to form an electrically continuous conductor within the first and second substrate.

Embodiments of the method further may include depositing a solder bump on the terminal pad. The method further may include applying solder/reflow to the conductor at the access hole. Milling through the first and second substrate may include milling to a ground plane substantially without piercing the ground plane. The conductive ink may be placed in contact with the ground plane such that the continuous conductor is electrically connected to the ground plane.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures.

DETAILED DESCRIPTION

Various aspects and embodiments are directed to compact, low profile interconnection systems and methods for electromagnetic circuits, and improved methods of manufacture of the same, that allow for ease of configurability, small sizes, and higher frequencies than conventional systems and methods.

Aspects and examples described provide radio frequency connectors and methods that advantageously apply additive and subtractive manufacturing techniques to provide low profile interconnections for the conveyance of various signals including radio frequency, direct current (DC), logic signals, or the like.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

The term "radio frequency" as used herein is not intended to refer to any particular frequency, range of frequencies, bands, spectrum, etc., unless explicitly stated and/or specifically indicated by context. Similarly, the terms "radio frequency signal" and "electromagnetic signal" are used interchangeably and may refer to a signal of any frequency. It should be appreciated that various embodiments of radio frequency circuits may be designed with dimensions selected and/or nominally manufactured to operate at various frequencies. The selection of appropriate dimensions may be had from general electromagnetic principles and are not presented in detail herein. The methods and apparatuses described herein may support smaller arrangements and dimensions than conventionally known, and may allow or accommodate the manufacture of electromagnetic circuits of smaller dimensions than conventionally known, and thereby may be particularly suitable for radio frequency circuits intended to be operated at higher frequencies than conventional methods.

Figure 1:
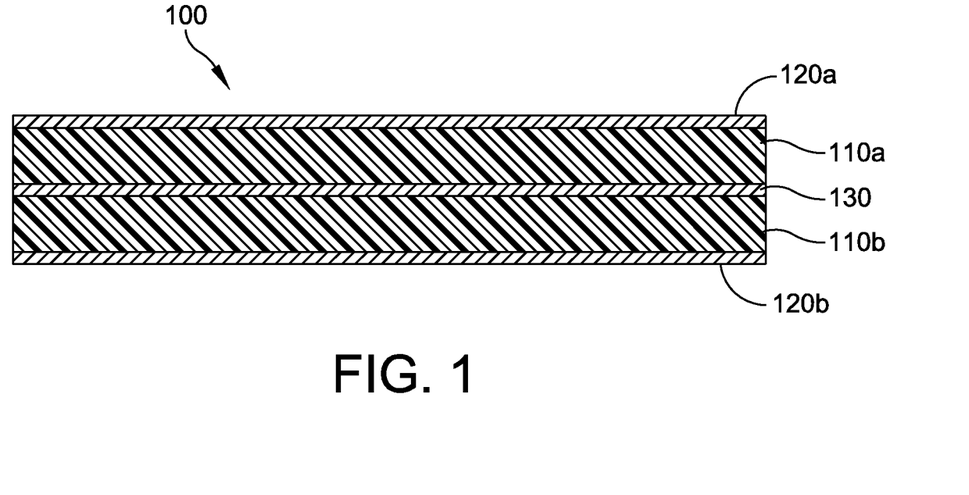
FIG. 1 is a schematic diagram of an example of two bonded substrates as may be suitable for an electromagnetic circuit.

FIG. 1 illustrates an electromagnetic circuit structure 100 that includes two substrates 110 bonded together, with ground planes 120 disposed on the outer surfaces thereof, and a circuit layer 130 disposed therebetween. The structure 100 is merely one example of a structure in which an electromagnetic circuit may be provided, and additional substrates having additional layers to accommodate additional circuit components may be provided in various embodiments. Typically, a portion of a circuit may be disposed on a particular layer, e.g., the circuit layer 130, with ground planes above and/or below (e.g., to maintain a characteristic impedance for signals on various traces or transmission lines on the circuit layer), and other portions of a total circuit (or system) may exist on other layers, to which the signals on the particular layer, circuit layer 130, must gain access.

Figure 2:
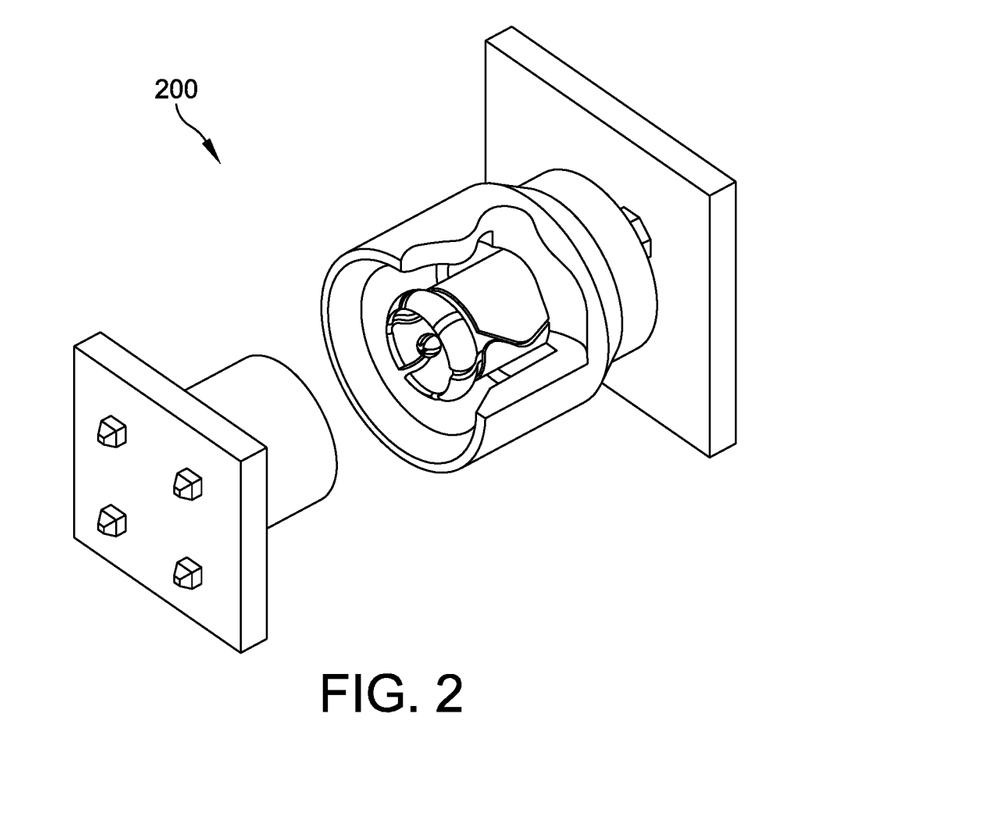
FIG. 2 is a schematic diagram of an example of a conventional connector for use with an electromagnetic circuit.

Transferring signals from one structure 100 to another structure 100 is conventionally accomplished via a connector, such as the connector 200 shown in FIG. 2, which is a surface connector that takes a lot of space, requires significant board separation, may be fragile due to the physical structure protruding from the circuit board and, due to its size, may be limited to certain frequency bands or have undesirable performance above certain frequencies. Conventional connectors also introduce additional height restrictions and cost.

Aspects and embodiments of systems and methods as described herein, however, provide for a low profile interconnection between circuits, providing reliable signal interconnects with flexible interchangeability, swappable quick connect and disconnect operations, that snap into place without cables, without costly/bulky connectors, and without torque or twisting application. Interconnect systems and methods described herein provide low-cost RF interfaces for PCB's, for board-to-board, board-to-cable, and board-to-flex connections.

Electromagnetic circuits and methods of manufacture in accord with those described herein include various additive manufacturing techniques to produce electromagnetic circuits and components capable of handling higher frequencies, with lower profiles, and at reduced costs, cycle times, and design risks, than conventional circuits and methods. Examples of techniques include milling of conductive material from a surface of a substrate to form signal traces or apertures of significantly smaller dimensions than allowed by conventional PCB processes, milling of one or more substrates to form a trench, using 3-dimensional printing techniques to deposit printed conductive inks into the trench to form a Faraday wall (a continuous electric barrier, as opposed to a series of ground vias with minimum spacing therebetween), "vertical launch" signal paths formed by milling (drilling) a hole through a portion of substrate and in which a wire is placed (and/or conductive ink is printed), to make electrical contact to a signal trace disposed on a surface of the substrate (or an opposing substrate), which may include forming a Faraday wall around the vertical launch conducting wire (which may be copper in some embodiments), and using 3-dimensional printing techniques to deposit printed resistive inks to form resistive components. Any of the above example techniques and/or others (e.g., soldering and/or solder reflow), may be combined to make various electromagnetic components. Aspects and examples of such techniques are described and illustrated herein with respect to a radio frequency interconnect to convey an electromagnetic signal to or from a layer of an electromagnetic circuit, but the techniques described may be used to form various electromagnetic components, connectors, circuits, assemblies, and systems.

Figure 3:
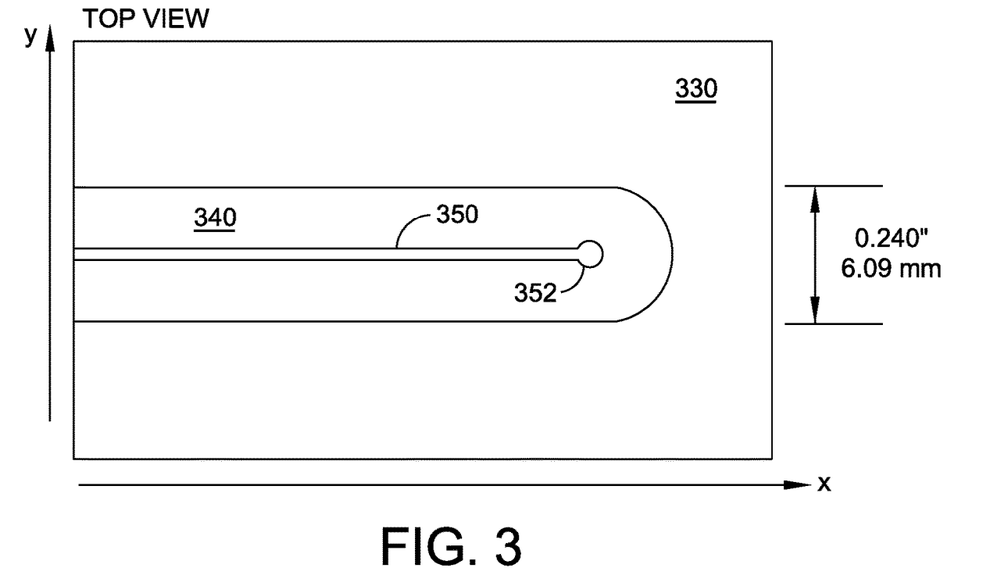
FIGS. 3, 3A and 3B are schematic diagrams of a stage of manufacture of an electromagnetic circuit interconnection.
Figure 3A:
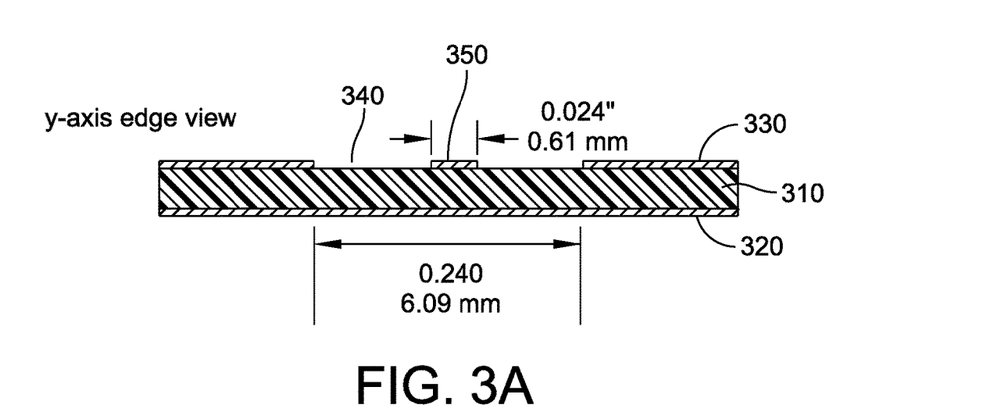
Figure 3B:
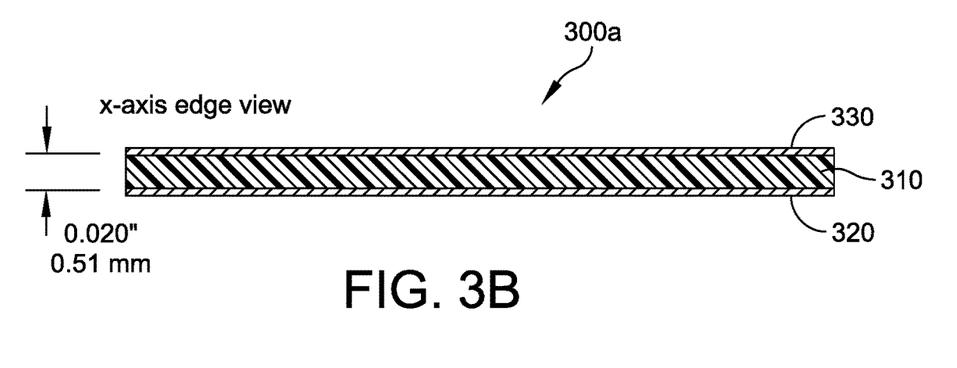

FIGS. 3, 3A and 3B show a structure 300a of an electromagnetic circuit, to include an interconnect, in one stage of manufacture in accord with aspects and embodiments of the systems and methods described herein. The structure 300a is a substrate 310 having a surface upon which is disposed a conductive material 320, such as electroplated copper, for instance, to form what may become a ground plane in some embodiments, and an opposing surface upon which is disposed another conductive material 330 (e.g., copper) that has been milled away (e.g., subtracted) to form various electrically conductive features. The features created by milling may form various components of an electromagnetic circuit, but the features of primary interest described herein are those related to providing a signal interconnect to convey signals from the structure 300a to other components. Accordingly, the milled features shown in FIG. 3 include the removed portion 340 to form a signal trace 350 and a terminal pad 352. While the terminal pad 352 in this example is generally round in shape, in various embodiments the terminal pad 352 may be of a shape other than shown and may merely be a terminal end of the trace 350 with no other distinguishing shape. As described, the electrical features formed from the conductive material 330 are formed by milling away portions of the conductive material 330.

Dimensional information shown in the figures is for illustrative purposes only and is representative of some dimensions that may be desirable or suitable for certain applications, and may be illustrative of some dimensions achievable with the methods described herein. In various embodiments, dimensions may be significantly smaller, or may be larger, depending upon the capabilities of the milling and additive equipment used in production, and depending upon the design and application of a particular circuit.

Figure 4:
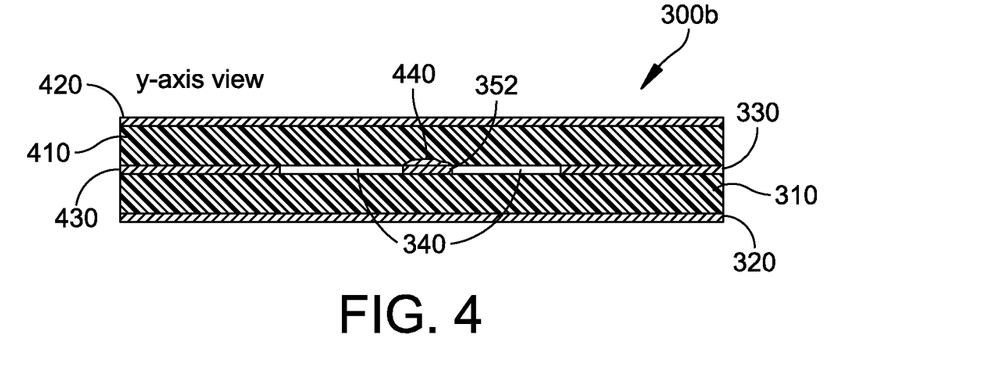
FIG. 4 is a schematic diagram of another stage of manufacture of an electromagnetic circuit interconnection.

FIG. 4 illustrates a structure 300b of an electromagnetic interconnect in another stage of manufacture. The structure 300b is similar to the structure 300a and includes all the elements of the structure 300a, and the structure 300b may be a next stage in the manufacture of an electromagnetic interconnect, but in various embodiments, the structure and features of an electromagnetic interconnect in accord with those described herein may be manufactured in differing orders. The structure 300b includes a second substrate 410, also having a surface with a conducting material 420 disposed thereon, and an opposing surface that is bonded (via a thin-layer bonding material 430) to, e.g., the structure 300a. A solder bump 440 may also be disposed upon the terminal pad 352, though not necessarily, and may be deposited on the terminal pad 352 prior to bonding the substrates 310, 410.

Figure 5:
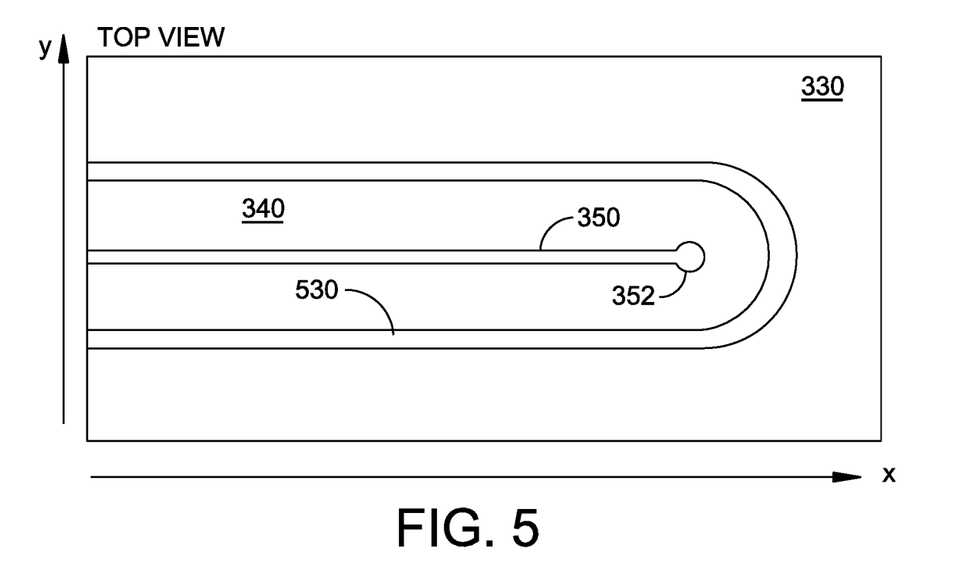
FIGS. 5 and 5A are schematic diagrams of another stage of manufacture of an electromagnetic circuit interconnection.
Figure 5A:
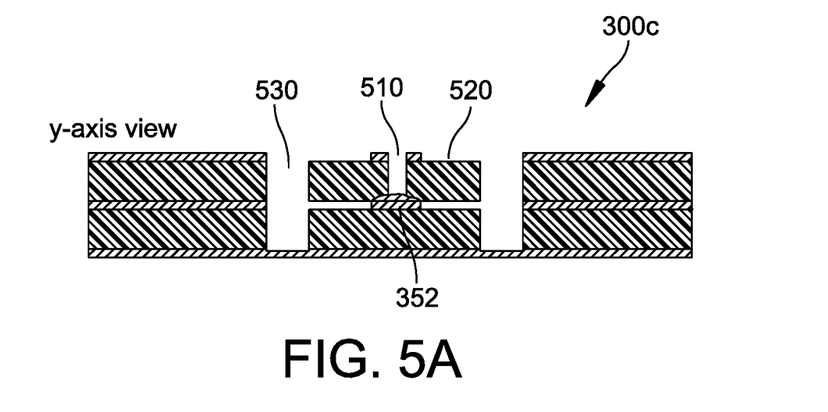

FIGS. 5 and 5A illustrate a structure 300c of an electromagnetic interconnect in another stage of manufacture. In the structure 300c, an access hole 510 has been milled (e.g., drilled) through the conductive material 420 and the substrate 410 to provide access to the terminal pad 352 (and optional solder bump 440). Additionally, a further milled portion 520 of the conductive material 420 have been removed to provide electrical isolation between the top opening of the access hole 510 and the remainder of conductive material 420. Further, a trench 530 has been milled through the conductive material 420 and the substrate 410 that provides access down to the conductive material 320 on the distal opposing surface of the structure 300c. The top view portion of FIG. 5 illustrates more detail of the location of the trench 530 in some embodiments. The top view portion is shown in the plane of the conductive material 330, where the signal trace 350 and the terminal pad 352 may reside, and therefore does not illustrate the access hole 510 or milled portion 520. For reference, the milled portion 520 may substantially be a region around the access hole 510, sufficient to prevent a future solder bump (or other conductive structure) at the access hole 510 from making an electrical connection to the remaining conductive material 420, e.g., "outside" the trench 530.

Figure 6:
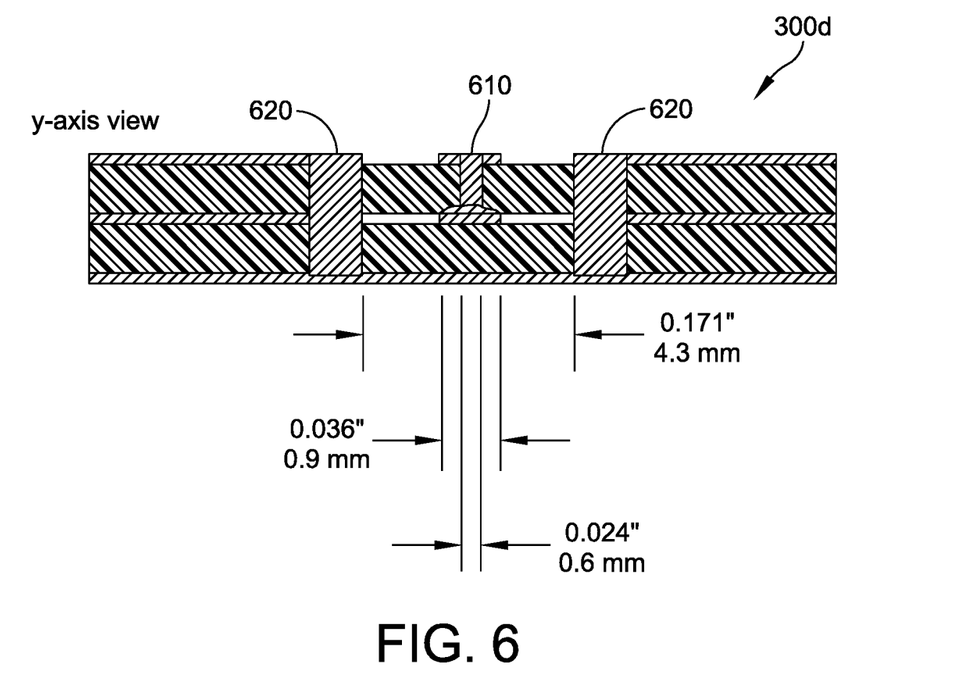
FIG. 6 is a schematic diagram of another stage of manufacture of an electromagnetic circuit interconnection.

FIG. 6 illustrates a structure 300d of an electromagnetic interconnect in yet another stage of manufacture. A conductor 610 is deposited into the access hole 510, and a conductive fill 620 is deposited into the trench 530. The conductor 610 in the access hole 510 may be formed by filling (depositing) conductive material or conductive ink in the hole 510 (such as by additive manufacturing, e.g., 3-D printing) in some embodiments, or by inserting a conductor into the hole 510. For example, the conductor 610 may be a solid conductor in some embodiments, such as a wire, and in some embodiments it may be a copper wire. In various embodiments, other conductive materials may be suitable depending upon the application. Further, a wire may be of round, square, or other cross-sectional shapes, and may be solid or hollow cored in various embodiments. In some embodiments, a solder reflow process may be applied to "adhere" the conductor 610 to the solder bump 440, and therefore to the terminal pad 352.

The conductive fill 620 may be of various conductive material, but filling by conductive ink (additively manufactured, e.g., by 3-D printing) may be preferable due to the more robust (and potentially less uniform and/or amorphous) shape of the trench 530 it fills. While the trench 530 is shown having some significantly linear portions, the trench 530 may take on any shape in various embodiments. A preferential shape of the trench 530 may be to parallel the signal trace 350, to either side of the signal trace 350, accommodating a signal trace 350 of various shapes to accommodate various circuit layouts. For comparison, various dimensional values are illustrated with respect to FIG. 6 (and FIG. 7). As described previously, the dimensional values are for illustrative purposes and various embodiments may have similar features of larger or smaller dimension.

The conductive fill 620 forms a Faraday wall. In various embodiments, the Faraday wall created by the conductive fill 620 may confine and isolate electromagnetic fields from neighboring circuit components. Further, Faraday walls may electrically couple two or more ground planes, such as may be formed by the conductive material 320 on a "bottom" side of the structure 300d, and the conductive material 420 on the "top" side.

Figure 7:
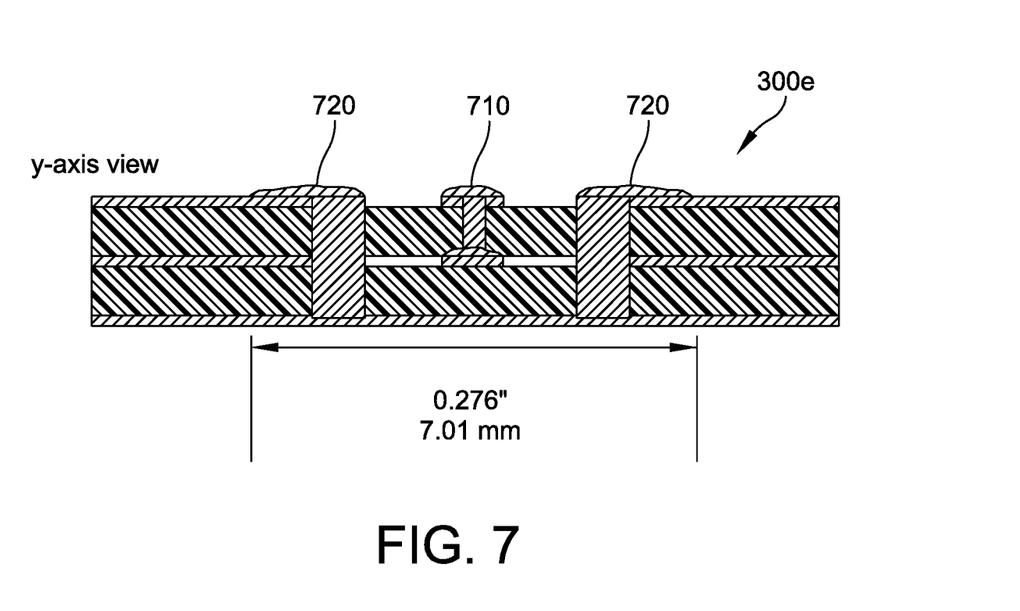
FIG. 7 is a schematic diagram of another stage of manufacture of an electromagnetic circuit interconnection.

FIG. 7 illustrates a structure 300e of an electromagnetic interconnect in yet another stage of manufacture. Here, a solder bump 710 is placed on the conductor 610, at the "top" surface of the structure 300e. Similarly, a solder bump 720 is placed on the conductive fill 620 and may function to ensure an electrical contact of the conductive fill 620 with the conductive material 420, which may be a ground plane in some embodiments. The solder bump 720 may, in some embodiments, be a ring of solder as viewed from the "top" plane of the structure 300e. In various embodiments, either or both of the solder bump 710 and the solder bump 720 may ultimately form a contact surface of the interconnect, configured to mate with similar solder bumps on a similar structure, or may form solder points for other circuit structures, such as commercially available connectors, cables, circuit elements, etc.

Figure 8:
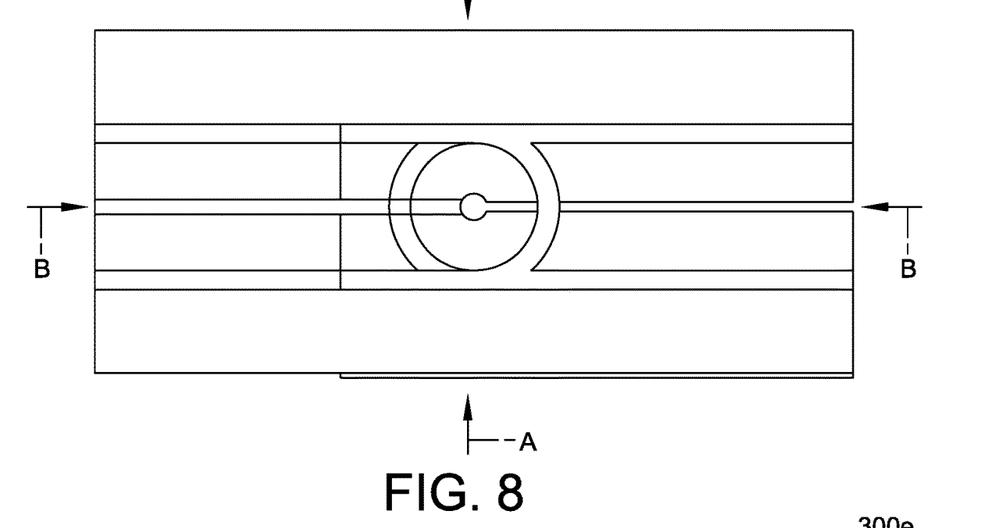
FIGS. 8, 8A and 8B are schematic diagrams of two electromagnetic circuit interconnections coupled together.
Figure 8A:
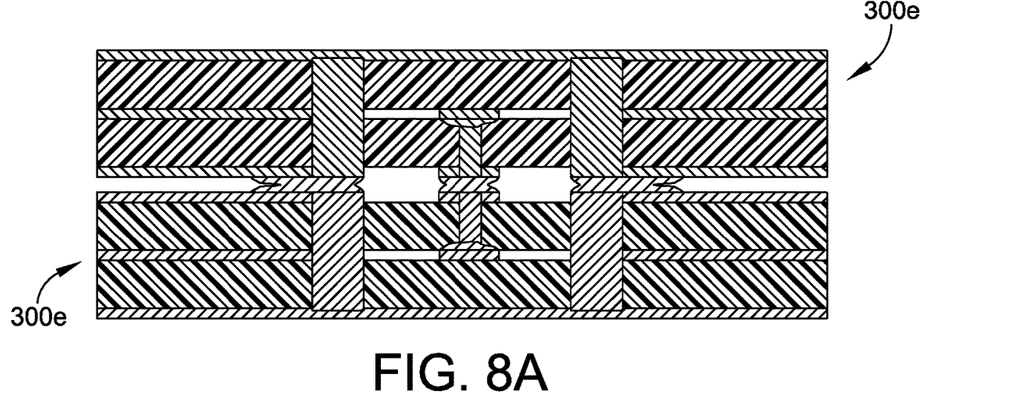
Figure 8B:
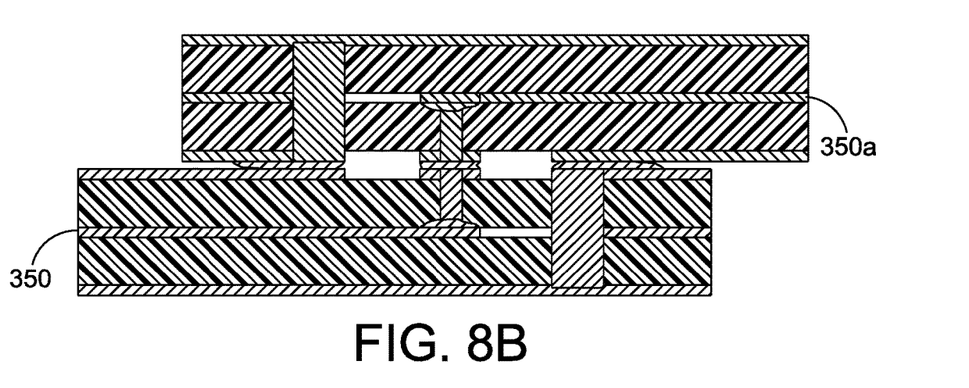

FIGS. 8, 8A and 8B illustrate the structure 300e of FIG. 7 coupled, or mated, with a comparable similar structure 300e. The respective solder bumps 710, 720 of each structure mate or make contact with each other, such that a signal on the signal trace 350 of either structure is conveyed to the signal trace 350 of the other structure. The ground planes (conductive materials 320, 420) and Faraday walls (conductive fill 620) form a substantially continuous electrical "cage" around the signal traces 350, which are "vertically" electrically connected through the conductors 610 (one per each structure 300e), and the respective solder bumps 710. Accordingly, a signal on either signal trace 350 may be said to be "vertically launched" to the other signal trace 350, as may best be seen in the B-B cross sectional view of the FIG. 8, i.e., FIG. 8B, wherein a first signal trace 350 makes electrical connection through to a second signal trace 350a, or vice versa.

Figure 9A:
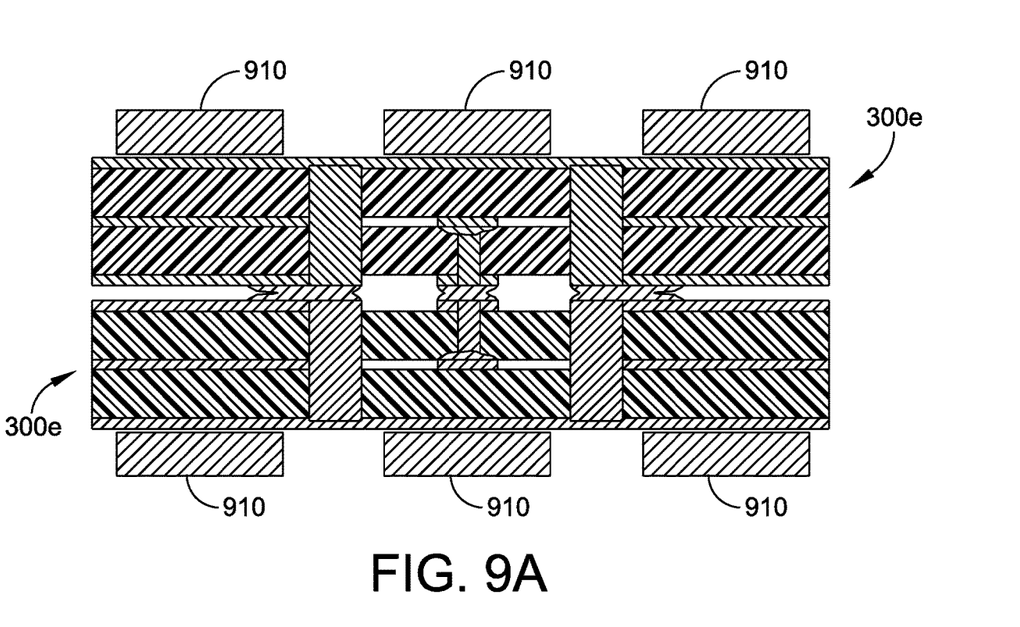
FIGS. 9A and 9B are schematic diagrams of the interconnection of FIGS. 8, 8A and 8B including additional elements to secure the interconnection.
Figure 9B:
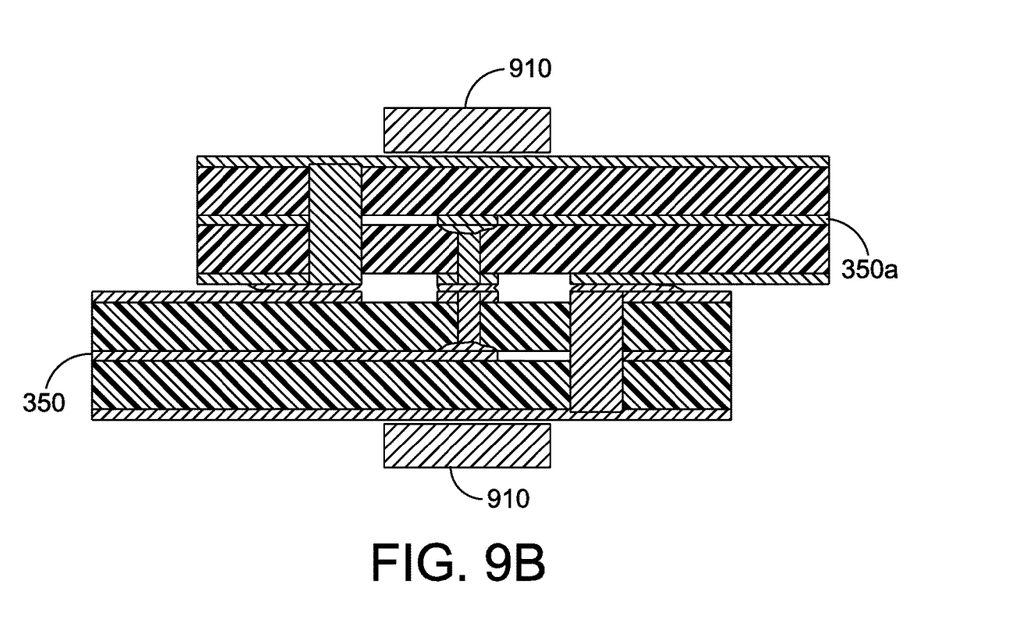
Figure 10:
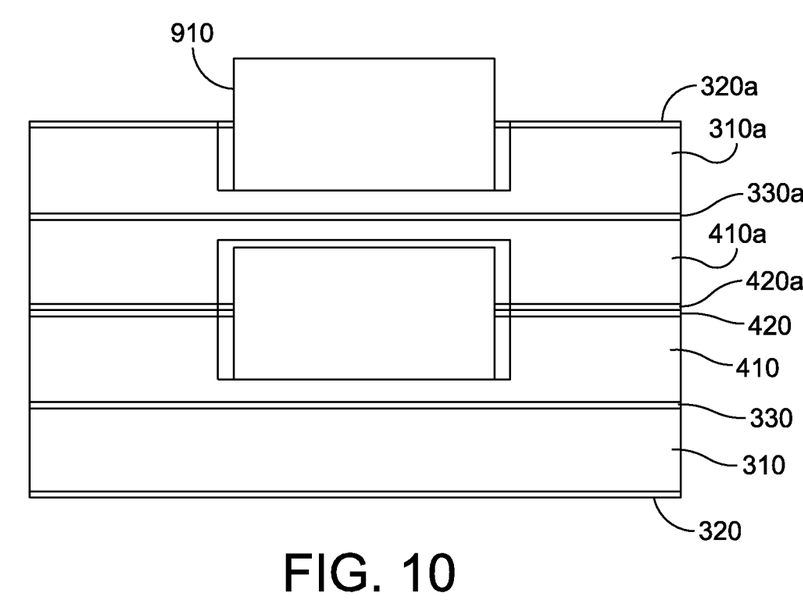
FIG. 10 is a schematic diagram showing detail of various embodiments of additional elements.
Figure 11:
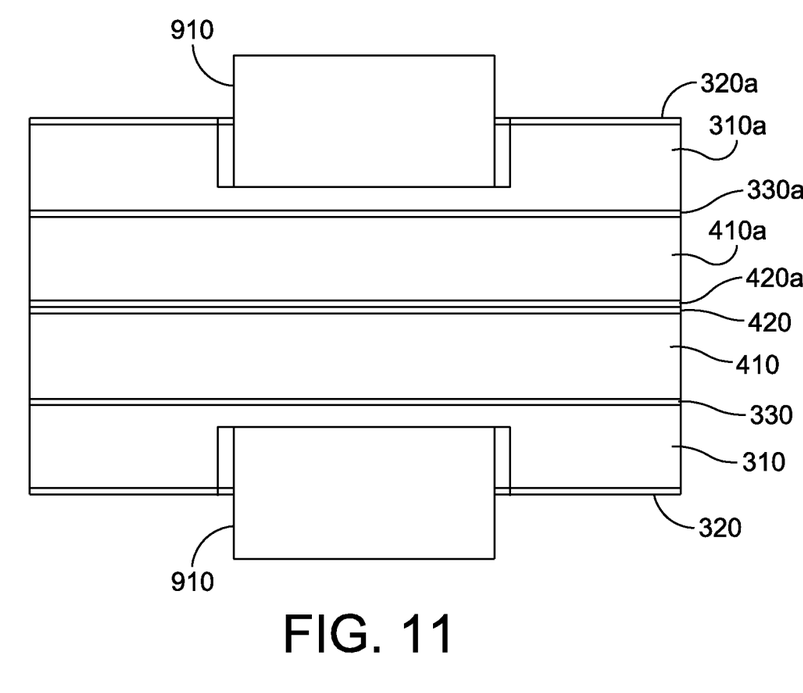
FIG. 11 is a schematic diagram showing detail of various embodiments of additional elements.

Two interconnects of relatively comparable structure to the structure 300e, as illustrated in FIGS. 8, 8A and 8B, may be securely mated or coupled by various means. FIGS. 9A and 9B illustrate a secure coupling by use of magnets 910 secured to each of the interconnect structures. The number and placement of magnets 910 is illustrative, and various embodiments may have more or fewer magnets 910 in differing physical arrangements. The magnets 910 may provide both alignment (by precise design, orientation, and placement of their magnetic fields) and secure connection (by the strength of their magnetic fields). FIGS. 10 and 11 illustrate alternate physical positioning of magnets 910, e.g., embedded in one or more of the substrates, e.g., substrate 310a and substrates 410, 410a as shown in FIG. 10 or substrate 310 and substrate 310a in FIG. 11. For example, the magnets 910 may be secured to an interconnect structure with bonding agents, or by pressure fitting into voids in the substrates designed to accommodate the magnets 910, or both, or other means. Additional or alternate means of aligning and securing the interconnect structures may be provided in various embodiments. For example, alignment pins, screws, clasps, or precise placement during a solder reflow operation (which may optional substantially permanently mate the interconnects, if desired), and the like, individually or in various combinations.

Further advantages of system and methods described herein may be realized. For example, conventional PCB manufacturing may impose limitations on circuit feature sizes, such as the width of signal traces, in comparison with systems and method described herein, thus limiting the highest frequencies for which conventionally made electromagnetic circuits may be suitable. Further, substrate thicknesses impact characteristic impedance (e.g., due to the distance to ground planes disposed upon opposing surfaces) in relation to width of the traces. Accordingly, wider traces required by conventional PCB processes cause selection of thicker substrates (to maintain a particular characteristic impedance), thus limiting how thin the circuit can be manufactured. For example, general recommendations under conventional PCB manufacturing include total thicknesses of about 60 mil (0.060 inches). By comparison, electromagnetic circuits in accord with aspects and embodiments described, using additive manufacturing techniques, can result in circuit boards having a low profile down to a thickness of about 10 mil or less, with signal line traces having widths of about 4.4 mil, or 2.7 mil, or less, and interconnect geometries substantially flush with a surface of the board.

Ground vias conventionally provide electrical connectivity between ground planes (e.g., on opposing surfaces of substrates) and provide some isolation of signals on the traces from other traces that may be nearby. The conventional ground vias are drilled holes of about 8 mil diameter or greater, and are required to be a minimum distance apart to maintain structural integrity of the board. Accordingly, ground vias are leaky structures, exhibiting loss of electromagnetic signal, especially at higher frequencies. As various applications require support for higher frequency signals, the minimum spacing between ground vias act like large openings through which relatively small wavelengths of electromagnetic energy may escape.

By comparison, electromagnetic circuits and methods in accord with aspects and embodiments described herein, which use additive manufacturing techniques, allow for electrically continuous structures to connect ground planes. Accordingly, an electrically continuous structure is provided and disposed vertically through one or more substrates, (e.g., between opposing surfaces of the substrate) to form "Faraday walls" that confine electric fields. In various embodiments, such Faraday walls may electrically couple two or more ground planes. Further in various embodiments, such Faraday walls may confine and isolate electromagnetic fields form neighboring circuit components. In some embodiments, such Faraday walls may enforce a boundary condition to limit electromagnetic signals to be locally transverse electric-magnetic (TEM) fields, e.g., limiting signal propagation to a TEM mode.

In various embodiments, various subtractive (milling, drilling), additive (printing, filling), and adherent (bonding) steps may be carried out, in various orders, with soldering and reflow operations as necessary, to form an electromagnetic circuit having one or any number of substrate layers, which may include one or more interconnect features as described herein.

A generalized method for making any of various electromagnetic circuits includes milling a conductive material disposed on a substrate to form circuit features, printing (or depositing, e.g., via 3-D printing, additive manufacturing techniques) additional circuit features, such as resistors formed of resistive ink, for example. The method may include depositing solder on any feature, as necessary, for example upon the terminal pad 352. The method may also include milling (or drilling) through substrate material (and/or conductive materials) to form openings, such as voids or trenches, and includes depositing or printing (e.g., via 3-D printing, additive manufacturing techniques) conductive material (such as conductive ink or a wire conductor) into the voids/trenches, for example to form Faraday walls or vertical signal launches (e.g., copper). Any of these steps may be done in different orders, repeated, or omitted as necessary for a given circuit design, and may include interconnect structures as described herein. In some embodiments, multiple substrates may be involved in the manufacture of an electromagnetic circuit, and the method includes bonding further substrates as necessary, and further milling and filling operations.

Having described several aspects of at least one embodiment and a method for manufacturing an electromagnetic circuit, the above descriptions may be employed to produce various electromagnetic circuits with an overall thickness of 10 mils (0.010 inches, 254 microns) or less, and may include signal traces, such as the traces as narrow as 4.4 mils (111.8 microns), 2.7 mils (68.6 microns), or even as narrow as 1.97 mills (50 microns), depending upon the tolerances and accuracy of various milling and additive manufacturing equipment used. Accordingly, electromagnetic circuits in accord with those described herein may be suitable for X-B and higher frequencies, and in some cases up to 70 GHz or more.

Additionally, electromagnetic circuits in accord with those described herein may have a low enough profile (e.g., thickness of 10 mils or less), with accordant light weight, to be suitable for outer space applications, including folding structures to be deployed by unfolding when positioned in outer space.

Further, electromagnetic circuits manufactured in accord with methods described herein accommodate less expensive and faster prototyping, without the necessity for caustic chemicals, masking, etching, electroplating, etc. Simple substrates with pre-plated conductive material disposed on one or both surfaces (sides) may form the core starting material, and all elements of an electromagnetic circuit may be formed by milling (subtractive, drilling), filling (additive, printing of conductive and/or resistive inks), and bonding one or more substrates. Simple solder reflow operations and insertion of simple conductors (e.g., copper wire) are accommodated by methods and systems described herein.

Further, electromagnetic circuits manufactured in accord with methods described herein may accommodate deployment on, or designs calling for, non-planar surfaces. Thin, low-profile electromagnetic circuits, such as described herein and others, may be manufactured using mill, fill, and bond techniques as described herein to produce electromagnetic circuits having any desired contour, to adhere to a surface (such as a vehicle) or to support a complex array structure, for instance.

An appendix that includes various additional details and aspects is filed concurrently herewith and is hereby incorporated in and part of this specification.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A radio frequency connector, comprising:
   a substrate;
   a first ground plane disposed upon the substrate;
   a signal conductor having a first contact point, the first contact point being configured to be electrically connected to a second contact point;
   a first ground boundary configured to be electrically connected to a second ground boundary, the first ground boundary being formed as an electrically continuous conductor within the substrate;
   an alignment element configured to align the first and second contact points; and
   a coupling element configured to provide contact between the first and second contact points,
   wherein the coupling element is a magnetic element.

2. The radio frequency connector of claim 1, wherein the coupling element is further configured to align the first and second contact points.

3. A radio frequency interconnect structure, comprising:
   a first connector including
      a first substrate,
      a first ground plane disposed upon the first substrate,
      a first signal conductor having a first contact point, and
      a first ground boundary formed as an electrically continuous conductor within the first substrate;
   a second connector including
      a second substrate,
      a second ground plane disposed upon the second substrate,
      a second signal conductor having a second contact point configured to be electrically connected to the first contact point of the first connector, and
      a second ground boundary formed as an electrically continuous conductor within the second substrate, the second ground boundary being configured to be electrically connected to the first ground boundary; and
   a coupling element configured to provide contact between the first contact point of the first connector and the second contact point of the second connector,
   wherein the coupling element is a magnetic element.

4. The radio frequency interconnect structure of claim 3, wherein the coupling element is further configured to align the first contact point of the first connector and the second contact point of the second connector.

* * * * *

UNITED STATES PATENT AND TRADEMARK OFFICE
CERTIFICATE OF CORRECTION

PATENT NO. : 10,849,219 B2
APPLICATION NO. : 16/287240
DATED : November 24, 2020
INVENTOR(S) : Thomas V. Sikina et al.

Page 1 of 1

It is certified that error appears in the above-identified patent and that said Letters Patent is hereby corrected as shown below:

In the Specification

Column 9, Line 5, delete "X-B" and insert -- X-Band --.

Signed and Sealed this
Eighth Day of June, 2021

Drew Hirshfeld
*Performing the Functions and Duties of the*
*Under Secretary of Commerce for Intellectual Property and*
*Director of the United States Patent and Trademark Office*